US010767810B2

United States Patent
Yamamori et al.

(10) Patent No.: US 10,767,810 B2
(45) Date of Patent: Sep. 8, 2020

(54) ELECTRONIC DEVICE HOLDER

(71) Applicant: Toshiba Client Solutions CO., LTD., Koto-ku, Tokyo (JP)

(72) Inventors: Kenji Yamamori, Tokyo (JP); Masanori Nakano, Tokyo (JP); Brad Chiu, Taipei (TW); Jonathan Lin, Taipei (TW); Walter Lin, Taipei (TW)

(73) Assignee: Toshiba Client Solutions CO., LTD., Tokyo (JP)

( * ) Notice: Subject to any disclaimer, the term of this patent is extended or adjusted under 35 U.S.C. 154(b) by 0 days.

(21) Appl. No.: 16/736,358

(22) Filed: Jan. 7, 2020

(65) Prior Publication Data
US 2020/0141535 A1 May 7, 2020

Related U.S. Application Data

(62) Division of application No. 16/038,943, filed on Jul. 18, 2018, now Pat. No. 10,663,108.

(30) Foreign Application Priority Data

Dec. 18, 2017 (JP) ................................. 2017-241772

(51) Int. Cl.
*H05K 5/02* (2006.01)
*F16M 13/02* (2006.01)
*F16M 11/04* (2006.01)
*H05K 7/14* (2006.01)

(52) U.S. Cl.
CPC ............ *F16M 13/02* (2013.01); *F16M 11/04* (2013.01); *A45F 2200/0525* (2013.01); *H05K 5/02* (2013.01); *H05K 7/14* (2013.01)

(58) Field of Classification Search
CPC ..... F16M 13/027; F16M 11/04; H05K 5/0204
See application file for complete search history.

(56) References Cited

U.S. PATENT DOCUMENTS

| 5,097,388 A | 3/1992 | Buist et al. |
| 6,520,605 B2* | 2/2003 | Nunokawa ........... H05K 5/0204 312/111 |
| 6,842,339 B2* | 1/2005 | Lin ........................ F16B 35/00 220/836 |
| 6,983,126 B1 | 1/2006 | Saalman |

(Continued)

FOREIGN PATENT DOCUMENTS

| JP | 2004-258934 A | 9/2004 |
| JP | 2007-102746 A | 4/2007 |
| JP | 2010-218525 A | 9/2010 |

*Primary Examiner* — Nkeisha Smith
(74) *Attorney, Agent, or Firm* — Knobbe, Martens, Olson & Bear, LLP

(57) ABSTRACT

According to one embodiment, a holder attaches a first electronic device and a second electronic device to a display. The holder includes a base structure, a first holder section, and a second holder section. The first holder section at a first portion of the base structure holds the second electronic device and includes a first through hole that receives a first male screw to be screwed into a first female screw of the first electronic device. The second holder section at a second portion of the base structure holds the second electronic device and includes a second through hole that receives a second male screw to be screwed into a second female screw of the first electronic device.

6 Claims, 10 Drawing Sheets

(56) References Cited

U.S. PATENT DOCUMENTS

| | | | |
|---|---|---|---|
| 7,719,832 B2 * | 5/2010 | Kobara | G06F 1/1601 361/679.02 |
| 7,813,118 B2 | 10/2010 | Burge | |
| 8,191,837 B2 | 6/2012 | Chen et al. | |
| 8,523,132 B2 | 9/2013 | Chen et al. | |
| 8,787,007 B2 | 7/2014 | Stokman | |
| 8,939,417 B1 | 1/2015 | Wengreen | |
| 9,169,964 B2 | 10/2015 | Herder et al. | |
| 9,660,466 B2 | 5/2017 | Ergun et al. | |
| 10,117,344 B2 | 10/2018 | Wengreen | |
| 10,299,400 B2 | 5/2019 | Wengreen et al. | |
| 2005/0211861 A1 | 9/2005 | Lee et al. | |
| 2008/0186669 A1 | 8/2008 | Chang | |
| 2009/0294599 A1 * | 12/2009 | Chen | G06F 1/1607 248/65 |
| 2010/0288895 A1 | 11/2010 | Shamie | |
| 2011/0292581 A1 | 12/2011 | Lin et al. | |
| 2015/0201756 A1 | 7/2015 | Chen | |
| 2015/0319871 A1 | 11/2015 | Asano | |
| 2015/0342153 A1 | 12/2015 | Hudepohl | |
| 2016/0070312 A1 | 3/2016 | Stackhouse | |
| 2016/0234955 A1 | 8/2016 | Wengreen et al. | |
| 2017/0208945 A1 | 7/2017 | Wengreen | |
| 2017/0211743 A1 | 7/2017 | Yanyk | |
| 2019/0002125 A1 | 1/2019 | Bin et al. | |
| 2019/0186685 A1 | 6/2019 | Yamamori et al. | |

\* cited by examiner

ELECTRONIC DEVICE HOLDER

CROSS-REFERENCE TO RELATED APPLICATIONS

This application is a divisional application of U.S. application Ser. No. 16/038,943, filed Jul. 18, 2018 (now U.S. Publication No. 2019/0186685), which is based upon and claims the benefit of priority from Japanese Patent Application No. 2017-241772, filed Dec. 18, 2017, the entire contents of which are incorporated herein by reference.

FIELD

Embodiments described herein relate generally to a holder that attaches an electronic device to a display.

BACKGROUND

A small-sized electronic device such as a personal computer (hereinafter referred to as a PC) may be attached to a display. On the backside of the display, a mount that attaches a stand or supporting column thereto is provided. It is difficult to directly attach the PC to the display, and hence a holder to which the PC is attached or in which the PC is stored may be attached to the mount. In general, the number of types of interface ports for electrical connection of a small-sized PC to an external device is small, and hence a port expansion adaptor that expands the types of interfaces may be electrically connected to a small-sized PC. However, there is no useful means for collectively attaching these devices to the display.

A conventional holder that attaches an electronic device such as a PC or the like to the display cannot collectively attach another electronic device required to use the small-sized PC such as a port expansion adaptor or the like in addition to the electronic device such as the small-sized PC.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

DETAILED DESCRIPTION

Figure 1:
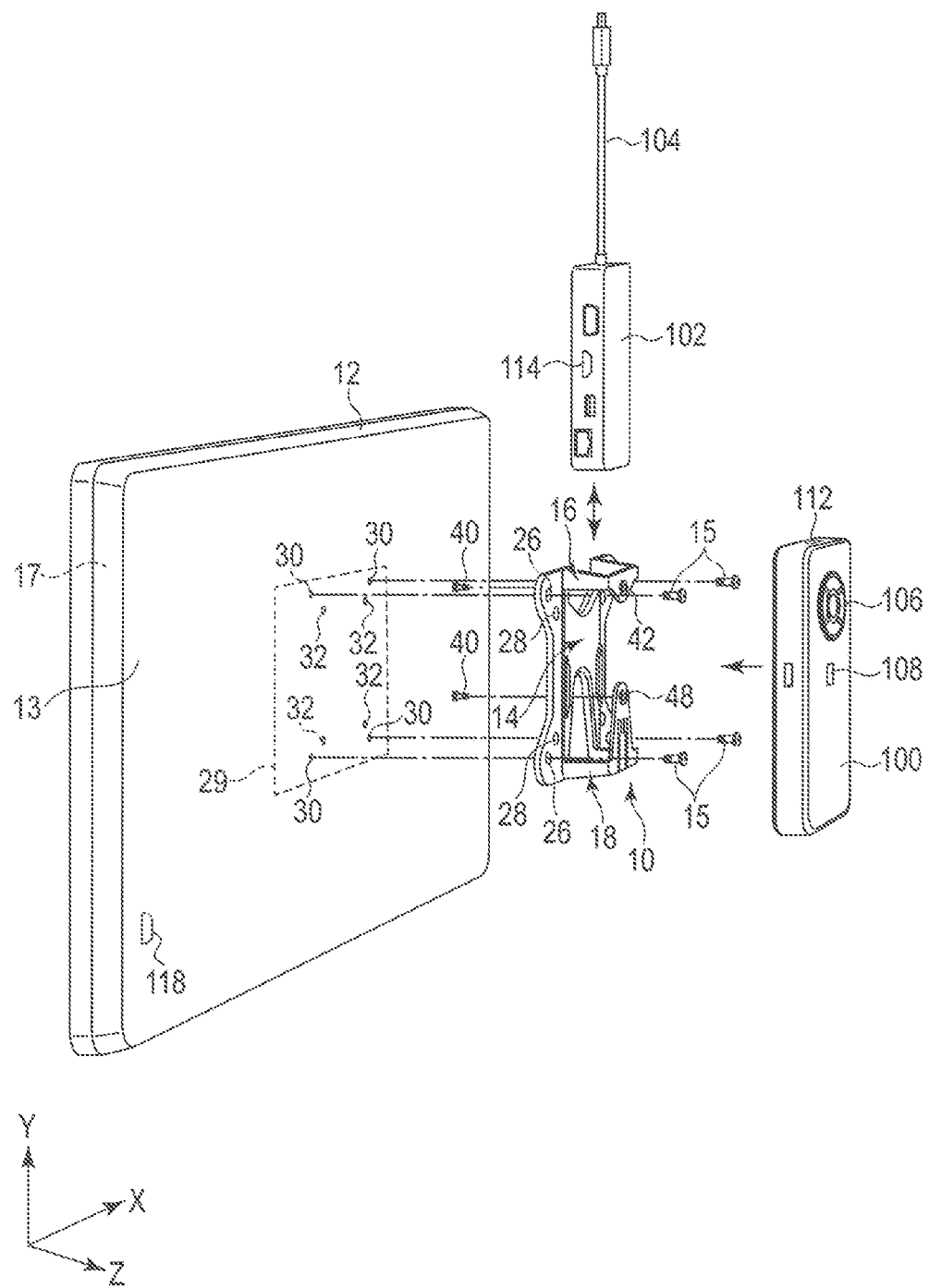
FIG. 1 is an exploded perspective view showing an example of a holder attaching a mobile PC and adaptor to a display according to a first embodiment.

Various embodiments will be described hereinafter with reference to the accompanying drawings. The disclosure is merely an example and is not limited by contents described in the embodiments described below. Modification which is easily conceivable by a person of ordinary skill in the art comes within the scope of the disclosure as a matter of course. In order to make the description clearer, the sizes, shapes and the like of the respective portions may be changed and illustrated schematically in the drawings as compared with those in an accurate representation. Constituent elements corresponding to each other in a plurality of drawings are denoted by like reference numerals and their detailed descriptions may be omitted unless necessary.

In general, according to one embodiment, a holder attaches a first electronic device and a second electronic device to a display. The holder includes:

a base structure comprising a base plate, the base plate comprising a group of through holes that receives a group of male screws to be screwed into a group of female screws of the display;

a first holder section at a first portion of the base structure, the first holder section holding the second electronic device and comprising a first through hole that receives a first male screw to be screwed into a first female screw of the first electronic device; and a second holder section at a second portion of the base structure, the second holder section holding the second electronic device and comprising a second through hole that receives a second male screw to be screwed into a second female screw of the first electronic device.

Examples of an electronic device to be attached to a display by using a holder according to an embodiment may include a small-sized portable mobile PC. The small-sized portable mobile PC may not include a display or a hardware keyboard in order to enhance downsizing and portability and/or flexibility in use by the user. When the mobile PC is used together with a wearable device or when the mobile PC is used as a wearable device, a hardware keyboard is unnecessary. When the mobile PC is used by being electrically connected to a wearable device of an eyeglass type or a head mount type, a display is unnecessary. When a hardware keyboard and a display are electrically connected to the mobile PC, the mobile PC is used as a desktop PC. In this case, when the mobile PC is attached to the backside of the display, a space-saving desktop PC is realized. The keyboard is not limited to the hardware keyboard, and a software keyboard displayed on a screen of the display may also be used.

Interfaces for external electrical connection of the mobile PC are limited due to demands for downsizing or the like. For example, the mobile PC is provided with a USB type-C (registered trade mark) connector, but may not be provided with an HDMI (registered trade mark) connector or a wired LAN connector. It is possible to electrically connect a port expansion adaptor provided with an HDMI connector, a wired LAN connector and the like to the USB type-C connector of the mobile PC, transmit a video signal from the mobile PC to the port expansion adaptor through a USB type-C cable, and then transmit the video signal from the HDMI connector of the port expansion adaptor to the display. When not only the mobile PC but also the port expansion adaptor is attached to the backside of the display, a further space-saving desktop PC with better operability is realized.

Although the electronic device is not limited to the small-sized mobile PC, here an embodiment of a holder that attaches the mobile PC and the port expansion adaptor to the display will be described as an example.

First Embodiment

Figure 2:
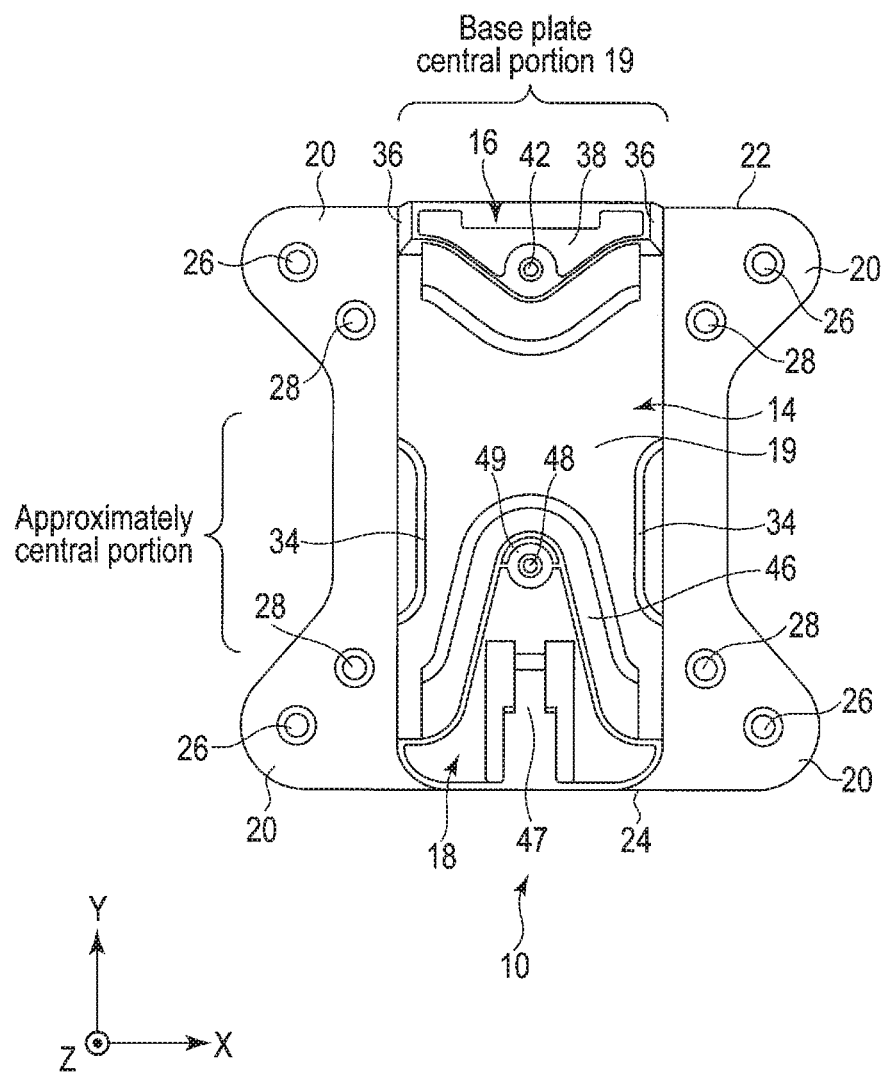
FIG. 2 is a front view showing an example of the holder.
Figure 3:
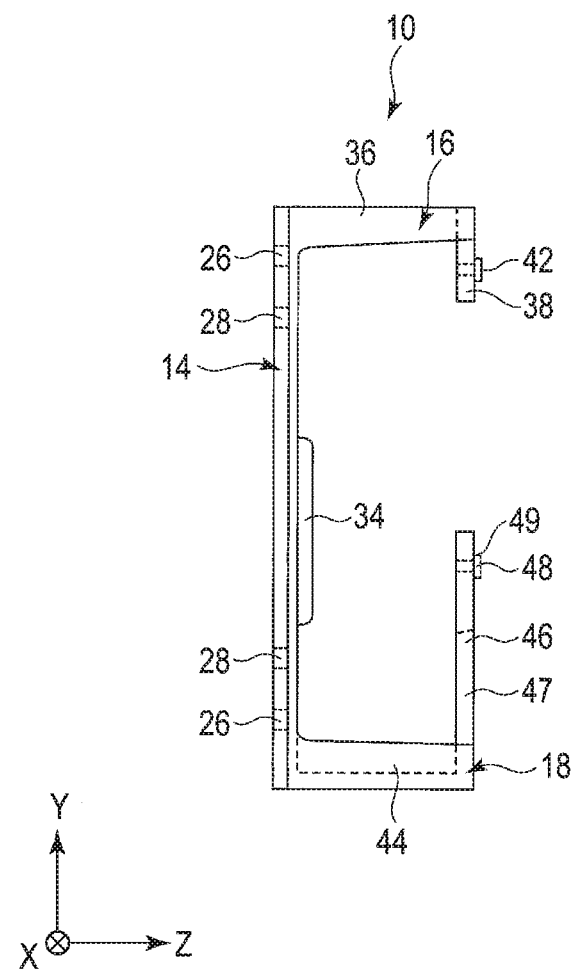
FIG. 3 is a side view showing an example of the holder.
Figure 4:
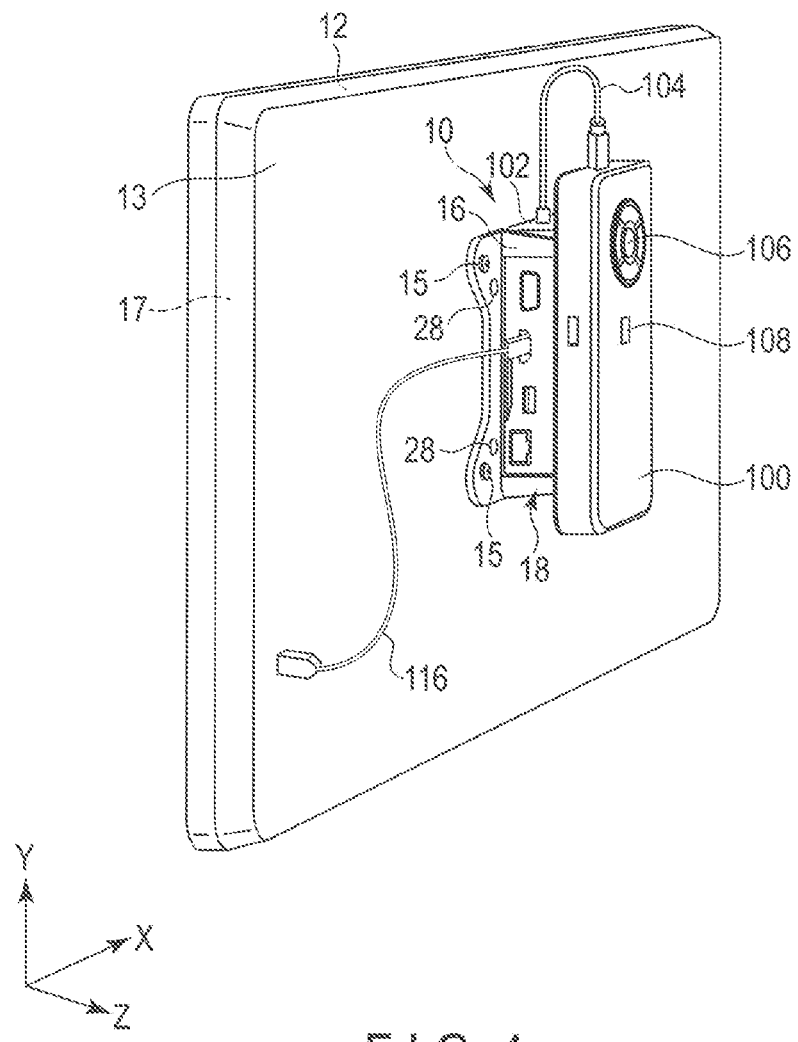
FIG. 4 is a perspective view showing an example of the holder.

A holder according to a first embodiment will be described with reference to FIG. 1 to FIG. 4. FIG. 1 is an exploded perspective view showing an example of the holder attaching the mobile PC and the port expansion adaptor to the display according to the first embodiment. FIG. 2 is a front view showing an example of the holder. FIG. 3 is a side view showing an example of the holder. FIG. 4 is a perspective view showing an example of the holder.

As shown in FIG. 1, a holder 10 is fixed to a backside 13 of a display 12 with four male screws 15. A mobile PC 100 and a port expansion adaptor 102 are attached to the holder 10. A front 17 of the display 12 is a display surface that displays an image. The lateral direction of the display 12 is the X direction, the longitudinal direction of the display 12 is the Y direction, and depth direction of the display 12 is the Z direction. Although the display 12 is, for example, a liquid crystal display device, the display 12 is not limited to this, and may be an organic EL display or the like.

The external appearance of the mobile PC 100 is a thin rectangular parallelepiped shape with a width of about 10 cm or less, height of about 20 cm or less, and thickness of about 2 cm or less, and a weight thereof is about 300 g or less. Accordingly, the mobile PC 100 can be held in a pocket of the work clothing, holster to be attached to a belt or a shoulder case, whereby the PC 100 is portable.

Although the mobile PC 100 incorporates therein semiconductor chips such as the CPU, semiconductor memory, and the like, and storage devices such as a Solid State Drive (SSD), and the like, the mobile PC 100 is not provided with a display and a hardware keyboard. A fingerprint sensor 108 is provided at a central portion of the front of mobile PC 100. The fingerprint sensor 108 is used for user authentication at the time of login of the mobile PC 100. Between the fingerprint sensor 108 and one end of the mobile PC 100 in the longitudinal direction thereof, five buttons 106 are provided. The five buttons 106 include a decision button arranged at the center and four buttons arranged above and below and on either side of the decision button. The five buttons 106 are used to input a command or the like when a hardware keyboard is not electrically connected to the mobile PC 100. It should be noted that the five buttons 106 may be allocated to numeric characters to input a password, and user authentication at the time of login may thereby be carried out, this enabling omission of the fingerprint sensor 108. Although not shown, the power for the mobile PC 100 may be supplied from an AC adaptor or may be supplied from an internal rechargeable battery.

Although not shown, two female screws are formed in the backside of the mobile PC 100 at two positions, and two male screws 40 are screwed into the female screws through the holder 10, whereby the mobile PC 100 is fixed to the holder 10. Accordingly, the holder 10 is provided with two through holes 42 and 48 into which the two male screws 40 are inserted. The mobile PC 100 is attached to the holder 10 in such a direction that the five buttons 106 are positioned above. The attaching direction of the holder 10 will be described later with reference to FIG. 2 and FIG. 3. A USB type-C connector 112 is provided in a side face of one end portion of the mobile PC 100 in the longitudinal direction thereof closer to the five buttons 106.

Although details will be described with reference to FIG. 2 and FIG. 3, the holder 10 includes an adaptor storage space that stores therein the port expansion adaptor 102, and one end of the adaptor storage space is opened, thereby forming an insertion opening. The port expansion adaptor 102 is inserted into the adaptor storage space through the insertion opening or is drawn out of the adaptor storage space through the insertion opening. A USB type-C cable 104 is led out of one end of the port expansion adaptor 102. The holder 100 stores therein the port expansion adaptor 102 is attached to the display in such a manner that the USB type-C cable 104 is positioned above. As shown in FIG. 4, a connector at a distal end of the USB type-C cable 104 is connected to the USB type-C connector 112 of the mobile PC 100. In the side face (left side face in FIG. 1) of the port expansion adaptor 102 when viewed from the display backside in the case where the port expansion adaptor 102 is attached to the display 12 in a state in which the port expansion adaptor 102 is stored in the holder 10, an HDMI connector 114, USB3.0 (registered trade mark) connector, wired LAN connector, and the like are provided. The HDMI connector 114 is electrically connected to an HDMI connector 118 provided in the backside of the display 12 through an HDMI cable 116.

A VESA mount section 29 in which a screw hole diameter, a screw pitch, withstand load, size of a fixing surface, and the like are specified by the Video Electronics Standards Association (VESA) standard is provided in the backside of the display 12. In the VESA standard, there are two sizes associated with screw arrangement. Female screws are formed at positions corresponding to four corners of a square, and the size of the square includes a first size of 100 mm×100 mm, and a second size of 75 mm×75 mm. A center of the square of the first size and a center of the square of the second size are coincident with each other. Although it is sufficient if the VESA mount section 29 supports one type of size, there is a VESA mount section in which two types of female screws are formed in order to support the two types of sizes. FIG. 1 shows an example in which four female screws 30 provided at positions corresponding to the four corners of the square of 100 mm×100 mm, and four female screws 32 provided at positions corresponding to the four corners of the square of 75 mm×75 mm are formed. The VESA mount section 29 has the two types of sizes, and hence when the holder 10 is configured in such a manner as to support both the sizes, through holes 26 are also formed at four positions of the holder 10 corresponding to the four female screws 30 of the VESA mount section 29, and through holes 28 are formed at four positions corresponding to the four female screws 32.

The mobile PC 100 is fixed to the holder 10 with the two male screws 40. The holder 10 is fixed to the VESA mount section 29 with four male screws 15. Although FIG. 1 shows an example in which the male screws 15 are screwed into the female screws 30 of the first size, the male screws 15 may be screwed into the female screws 32 of the second size.

The holder 10 is fixed to the backside of the display 12 and, thereafter the port expansion adaptor 102 is inserted from above into the adaptor storage space of the holder 10 as indicated by an arrow of FIG. 1. Thereby, the mobile PC 100 and port expansion adaptor 102 are attached to the display 12 by using the holder 10. Moreover, the port expansion adaptor 102 is detachably attached.

Details of the holder 10 will be described below with reference to FIG. 2 and FIG. 3. The holder 10 is formed of a base plate 14, an upper holding section 16, and a lower holding section 18 which are formed of a resin or the like and integral with each other as one body. The space surrounded with the base plate 14, the upper holding section 16, and the lower holding section 18 is the adaptor storage space that stores therein the port expansion adaptor 102. The upper holding section 16 forms a releasing section, and the port expansion adaptor 102 is inserted into the adaptor storage space through the releasing section, or is drawn out of the adaptor storage space through the releasing section. The surface of the holder 10 or base plate 14 on the display 12 side is referred to as a backside, and the surface on the opposite side thereof is referred to as a front or front surface.

The base plate 14 has an approximately flat plate-like shape, and includes a projection portion 20 a front edge of which is formed into a semicircular shape at each of four corners of the base plate 14, i.e., right and left corners on the upper and lower sides. An upper edge 22 of the base plate 14 is aligned with an upper end of each of the projection portions 20 on both the upper right and left sides, and a lower edge 24 of the base plate 14 is linearly continuous with a lower end of each of the projection portions 20 on both the lower right and left sides.

In each of the projection portions 20 of the base plate 14, each of the four through holes 26 and 28 are provided. The four male screws 15 to be screwed into the four female screws 30 or 32 of the VESA mount section 29 are passed through the through holes 26 or 28. More specifically, the four through holes 26 are arranged at four corners of the square of 100 mm×100 mm, and the four through holes 28 are arranged at four corners of the square of 75 mm×75 mm.

As shown in FIG. 2, at an approximately central portion in the vertical direction of a base plate central portion 19, two guide plates 34 slightly protruding from the base plate 14 are provided separately from each other. The two guide plates 34 are provided with an interval corresponding to the width of the port expansion adaptor 102 held between them, and are provided to support the port expansion adaptor 102 at both sides thereof, and smoothly carry out attachment/detachment of the port expansion adaptor 102.

The upper holding section 16 is provided with a pair of supporting guides 36 forwardly protruding from both the right and left sides of the upper portion of the base plate 14, and flat-plate-like coupling plate 38 that couples the right and left supporting guides 36 to each other. The supporting guides 36 are approximately perpendicular to the base plate 14, and the coupling plate 38 is approximately parallel to the base plate 14. The supporting guides 36 and the coupling plate 38 may be formed integral with each other. As indicated by an arrow in FIG. 1, the port expansion adaptor 102 can be inserted into the holder 10 through the insertion opening formed by the base plate 14, the supporting guides 36, and the coupling plate 38 or to be drawn out of the holder 10 through the insertion opening. The size of the insertion opening is determined such that there is somewhat room inside relative to the cross-sectional size of the port expansion adaptor 102. In the coupling plate 38 of the upper holding section 16, a through hole 42 used to pass the male screw 40 to be screwed into the female screw provided in the mobile PC 100 is provided.

The lower holding section 18 is provided with a bottom plate 44 forwardly protruding from a lower portion of the base plate 14, and a front plate 46 rising from the bottom plate 44 and upwardly extending toward the upper portion of the base plate 14 approximately in parallel with the base plate 14. The base plate 14, the bottom plate 44, and the front plate 46 constitute the adaptor storage space that longitudinally stores therein the port expansion adaptor 102. The lower end of the port expansion adaptor 102 inserted through the insertion opening of the upper holding section 16 is received by the bottom plate 44.

In the upper portion of the front plate 46, a through hole 48 that passes the male screw 40 (see FIG. 1) to be screwed into the female screw provided in the mobile PC 100 is provided. The through hole 48 is provided at the center of a screw section 49. The distance between the through hole 42 provided in the coupling plate 38 and through hole 48 provided in the front plate 46 is equal to the distance between the female screws provided in the mobile PC 100.

It should be noted that although an engaging piece 47 is also formed on the front plate 46, the engaging piece 47 is used in the second embodiment, and is not used in the first embodiment, and hence a description thereof is omitted here.

Next, an example of a procedure for attaching the mobile PC 100 and the port expansion adaptor 102 to the display 12 by using the holder 10 of the first embodiment will be described below. First, the two male screws 40 are passed through the through holes 42 and 48 provided in the coupling plate 38 and the front plate 46 of the holder 10, and the two male screws 40 are screwed into the two female screws (not shown in the drawings) provided in the mobile PC 100. Thereby, the mobile PC 100 is fixed to the holder 10.

When the mobile PC 100 has been fixed to the holder 10, the four male screws 15 are passed through the through holes 26 or 28 provided in the projection portions 20 of the holder 10, and the four male screws 15 are screwed into the four female screws 30 or 32 of the VESA mount section 29 provided on the backside of the display 12. Although FIG. 1 shows an example in which the male screws 15 are screwed into the female screws 30 of the first size, the male screws 15 may also be screwed into the female screws 32 of the second size.

Thereby, the holder 10 is fixed to the display 12, and the mobile PC 100 is fixed to the backside 13 of the display 12 through the holder 10. Then, the port expansion adaptor 102 is inserted into the adaptor storage space surrounded with the base plate 14, the upper holding section 16, and the lower holding section 18 through the releasing section of the upper holding section 16 of the holder 10 fixed to the display 12. The port expansion adaptor 102 is inserted into the adaptor storage space such that the USB type-C cable 104 is positioned above.

When the lower portion of the port expansion adaptor 102 inserted into the adaptor storage space through the releasing section of the upper holding section 16 comes into contact with the bottom plate 44 of the lower holding section 18, the port expansion adaptor 102 is securely held in the holder 10 by the upper holding section 16 and the lower holding section 18 in a state where the port expansion adaptor 102 is caught by the front plate 46 and the base plate 14.

When the port expansion adaptor 102 is held in the holder 10, the USB type-C cable 104 is inserted into the USB type-C connector 112 of the mobile PC 100 to thereby electrically connect the port expansion adaptor 102 and the mobile PC 100 to each other. Furthermore, the HDMI connector 114 of the port expansion adaptor 102 and the HDMI connector 118 provided in the backside of the display 12 are electrically connected to each other through the HDMI cable 116, whereby the mobile PC 100 is electrically connected to the display 12. This state is shown in FIG. 4.

As described above, according to the first embodiment, the holder 10 can attach the mobile PC 100 and the port expansion adaptor 102 serving as an accessory thereof to the display 12. The port expansion adaptor 102 is interposed between the rear surface of the display 12 and the backside of the mobile PC 100, and hence what are required of the adaptor storage space of the holder 10 for storing therein the port expansion adaptor 102 with respect to the front-back direction are only the upper holding section 16, the lower holding section 18, and the guide plates 34, and hence the configuration of the holder 10 is simple. The mobile PC 100 is screwed to the holder 10 from the inside of the holder 10, and hence it is difficult to easily detach the mobile PC 100 from the holder 10. Thereby, an effect of deterring that the small-sized mobile PC 100 is maliciously detached or is stolen can be expected.

The port expansion adaptor 102 is not fixed to the holder 10 with screws, and is only stored in the space defined by the upper holding section 16, the lower holding section 18 and the guide plates 34, and hence can be easily detached from the holder 10. When the mobile PC 100 is not used, it is possible to connect the port expansion adaptor 102 to some other device and use it. Alternatively, when a software keyboard is displayed on the screen by an application program, the unnecessary port expansion adaptor 102 can be detached.

Second Embodiment

Figure 5:
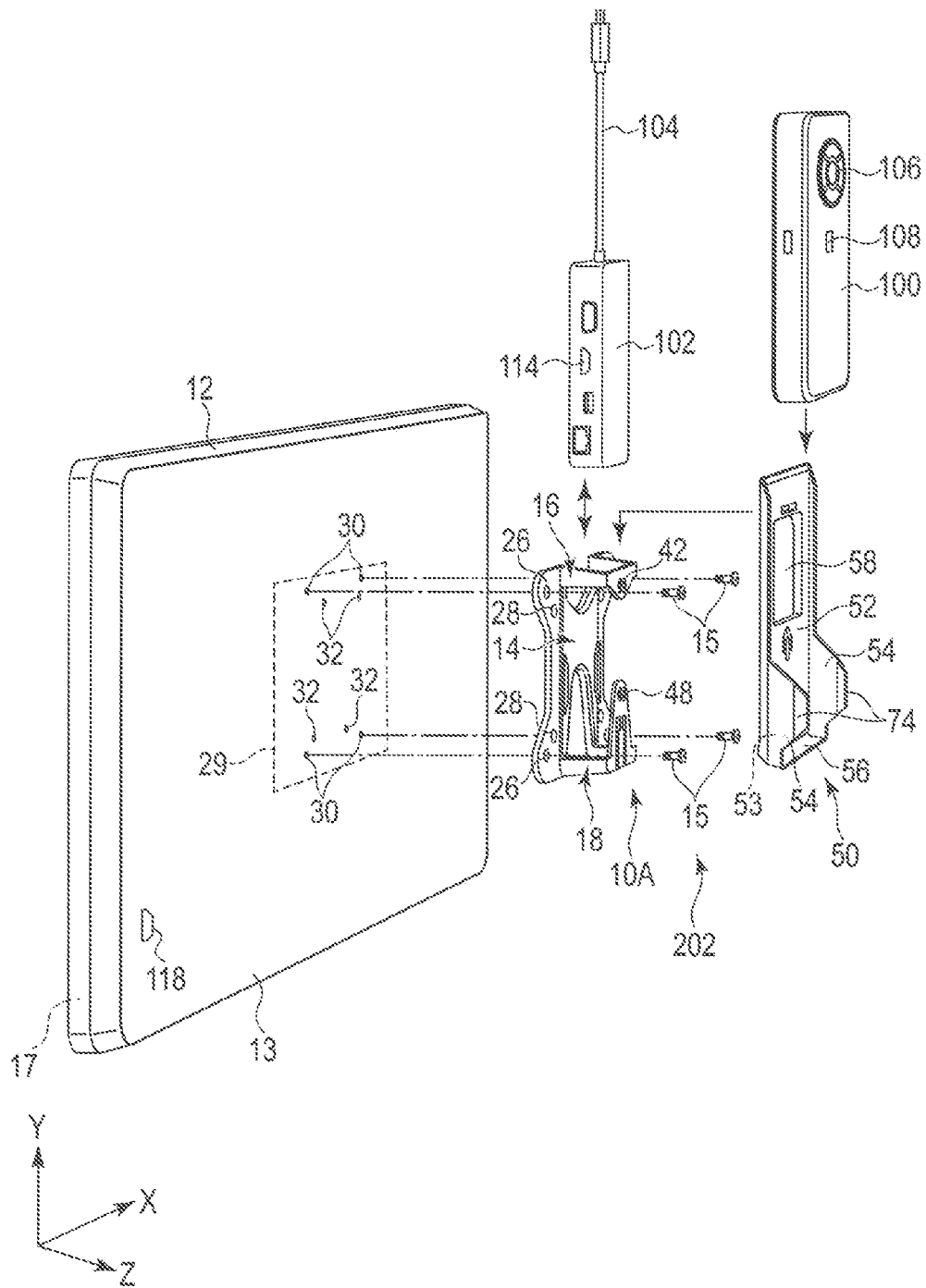
FIG. 5 is an exploded perspective view showing an example of a holder attaching a mobile PC and adaptor to a display according to a second embodiment.
Figure 6:
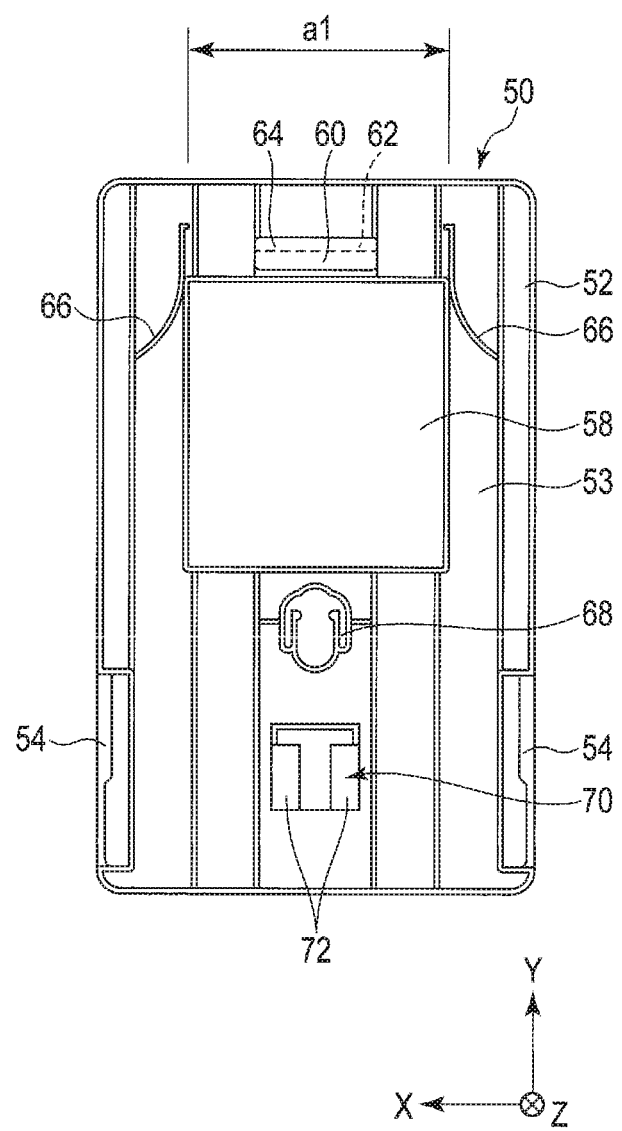
FIG. 6 is a rear view of an example of a first holder section to which the mobile PC is to be attached viewed from the display side.
Figure 7:
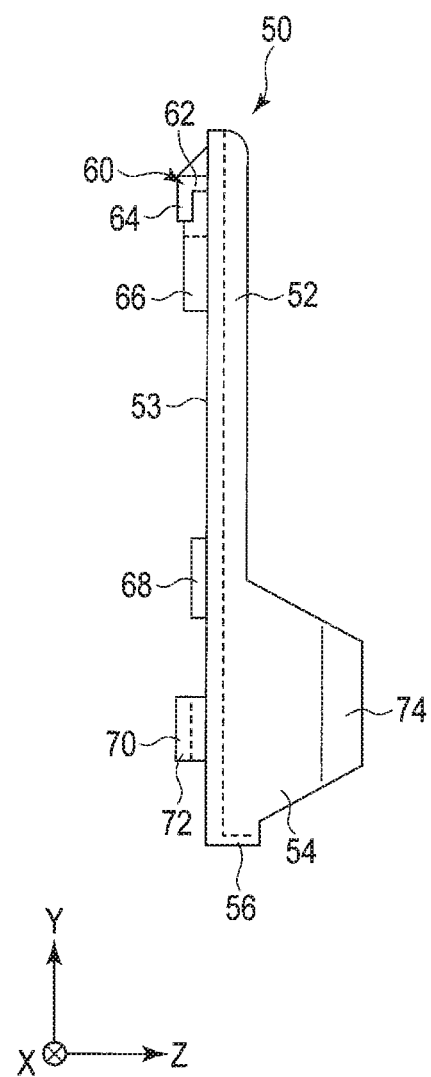
FIG. 7 is a side view of an example of the first holder section.
Figure 8:
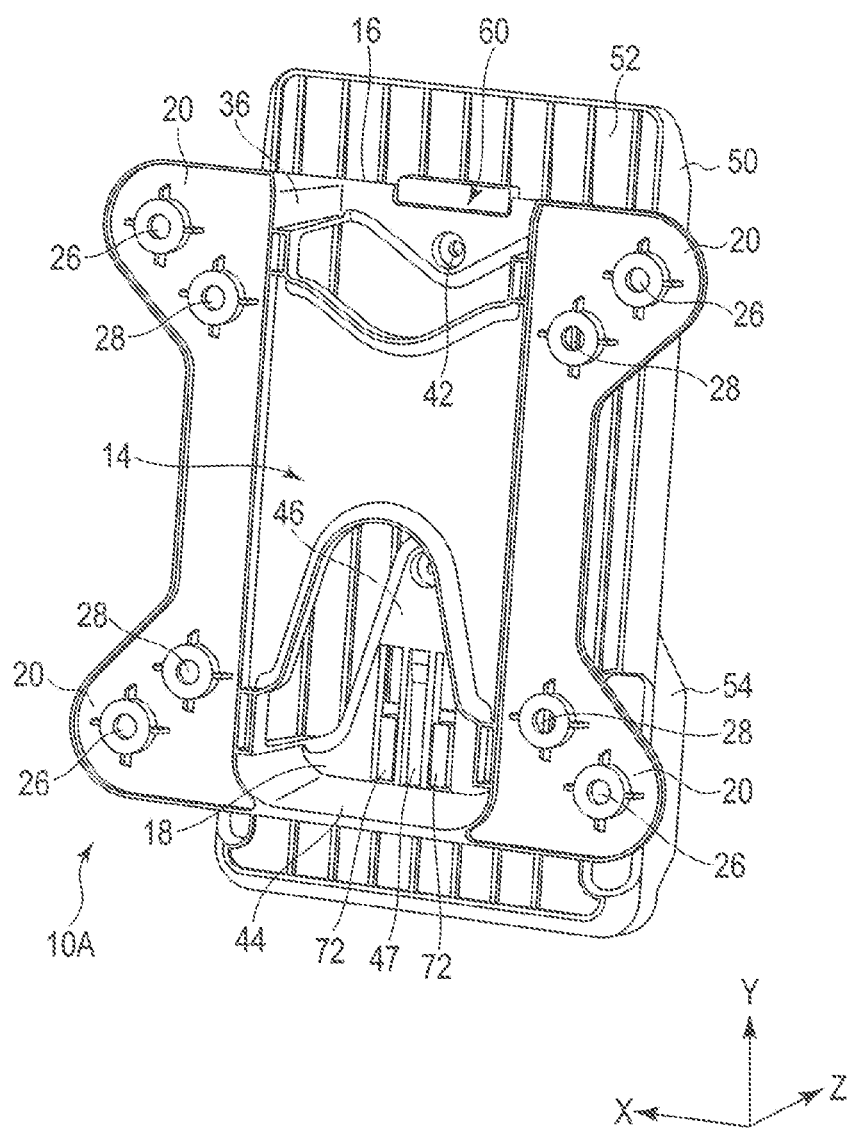
FIG. 8 is a perspective view of an example of the first holder section attached to a second holder section viewed from the display side.
Figure 9:
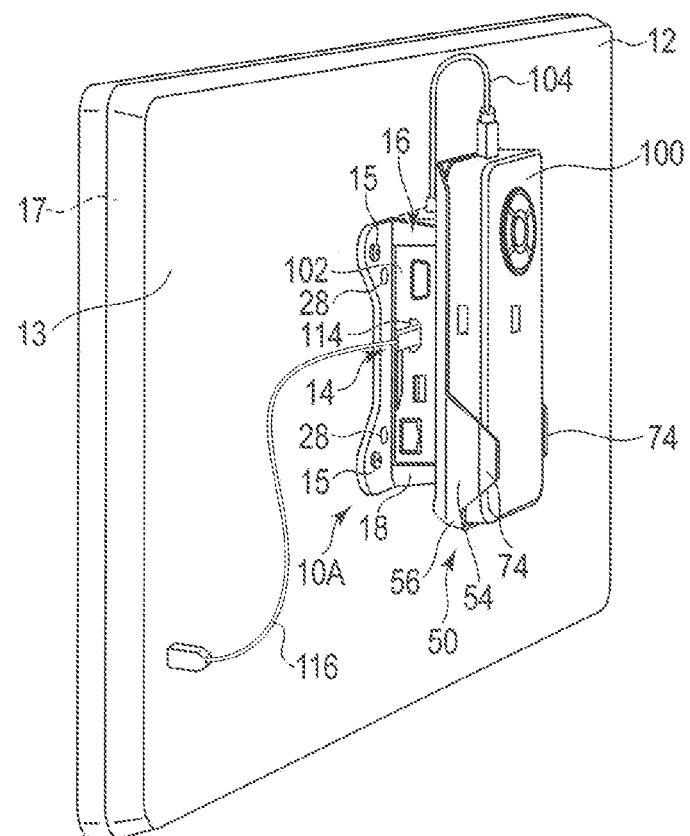
FIG. 9 is a perspective view showing an example of the holder according to the second embodiment.

A holder according to a second embodiment will be described below with reference to FIG. 5 to FIG. 9. FIG. 5 is an exploded perspective view showing an example of the holder according to the second embodiment for attaching a mobile PC and adaptor to a display. FIG. 6 is a rear view of an example of a first holder section to which the mobile PC is attached viewed from the display side. FIG. 7 is a side view of an example of the first holder section. FIG. 8 is a perspective view of an example of the first holder section attached to a second holder section viewed from the display side. FIG. 9 is a perspective view showing an example of the holder according to the second embodiment.

As shown in FIG. 5, a holder 202 of the second embodiment is provided with the holder 10 (referred to as a first holder section 10A in the second embodiment) of the first embodiment and a second holder section 50. The second holder section 50 detachably stores therein the mobile PC 100, and is detachably attached to the front side of the first holder section 10A. Although the first holder section 10A of the second embodiment may be identical to the holder 10 of the first embodiment, the through hole 42 of the coupling plate 38 and the through hole 48 of the front plate 46 are not used, and hence may be omitted. Further, the engaging piece 47 not used in the holder 10 of the first embodiment is used to detachably attach the second holder section 50 to the first holder section 10A in the second embodiment.

As shown in FIG. 6, FIG. 7, and FIG. 8, the second holder section 50 is provided with a holding plate 52, a pair of right and left supporting guides 54 provided at a lower portion of the holding plate 52, and a bottom plate 56 forwardly protruding from the lower portion of the holding plate 52. The holding plate 52, the supporting guides 54, and the bottom plate 56 may be formed integral with each other as one body. The holding plate 52 has an approximately plate-like rectangular shape, and a window 58 is provided at a central portion thereof.

As shown in FIG. 6, FIG. 7, and FIG. 8, at an upper portion of the backside of the second holder section 50, a first engaging section 60 having a hook-like shape when viewed from the lateral direction is provided. The first engaging section 60 includes an upper plate 62 extending from the backside of the holding plate 52 at an upper portion thereof, and lower plate 64 provided at a rear end of the upper plate 62 and extending downwardly, thereby forming the hook-like shape. A gap between the lower plate 64 and the holding plate 52 corresponds to the thickness of the coupling plate 38 provided on the first holder section 10A in the front-back direction.

The window 58 is formed at an upper portion of the central portion of the holding plate 52, the central portion being at a central portion in the horizontal direction. On both the upper right and left sides of the window 58, guide plates 66 each having a predetermined height are provided. The guide plates 66 are provided on the backside 53 of the holding plate 52 approximately at right angles thereto, and are curved to be downwardly spread when viewed from the back. The distance a1 between the upper ends of the right and left guide plates 66 corresponds to the width of the coupling plate 38 of the first holder section 10A in the horizontal direction.

A screw holding member 68 is provided beneath the window 58. The screw holding member 68 is formed in such a manner as to correspond to the screw section 49 around the through hole 48 provided in the front plate 46 of the first holder section 10A.

A second engaging section 70 is provided beneath the screw holding member 68. The second engaging section 70 is formed of two right and left longitudinal pieces 72 provided in opposition to each other with a central gap held between them. The gap between the longitudinal pieces 72 is provided in such a manner as to correspond to the engaging piece 47 (see FIG. 2) formed on the front plate 46 of the lower holding section 18 of the first holder section 10A.

As shown in FIG. 2, the engaging piece 47 is provided in the longitudinal direction at the central portion of the front plate 46 in the horizontal direction. Further, the engaging piece 47 has a width of an upper portion thereof and width of a lower portion thereof different from each other. The width of the upper portion is formed somewhat narrower than the width of the gap between the longitudinal pieces 72 of the second engaging section 70. The width of the lower portion is formed narrower than the width of the second engaging section 70 and wider than the width of the gap between the longitudinal pieces 72. Furthermore, the engaging piece 47 is formed in such a manner that the thickness thereof in the front-back direction is somewhat thinner than the gap between the longitudinal pieces 72 and the holding plate 52 in the front-back direction.

The supporting guides 54 of the second holder section 50 are provided on the right and left sides of the holding plate 52 with an interval corresponding to the width of the mobile PC 100 held between them. The supporting guides 54 forwardly extend from the holding plate 52, and an inwardly bent section 74 is formed at the front edge of each of the supporting guides 54. Each of the bent sections 74 has a height corresponding to the thickness of the mobile PC 100. Thereby, the mobile PC 100 arranged between the right and left supporting guides 54 is supported by the supporting guides 54.

The bottom plate 56 forwardly extends from the lower end of holding plate 52 by a predetermined length. The lower side face of the mobile PC stored in the space between the right and left supporting guides 54 comes into contact with the bottom plate 56, and the mobile PC 100 is supported by the bottom plate 56 from below.

Next, an example for attaching the mobile PC 100 and the port expansion adaptor 102 to the display 12 by using the holder 202 according to the second embodiment will be described below. First, as shown in FIG. 5 and FIG. 9, the first holder section 10A is fixed to the VESA mount section 29 on the backside 13 of the display 12 by means of the male screws 15. After the first holder section 10A is fixed to the display 12, the first engaging section 60 of the second holder section 50 is hung on the upper portion of the coupling plate 38 of the first holder section 10A. At the same time, the second engaging section 70 is fitted on the engaging piece 47 of the first holder section 10A. Thereby, the second holder section 50 is attached to the first holder section 10A. Thereafter, the mobile PC 100 is attached to the second holder section 50, and the port expansion adaptor 102 is inserted into the first holder section 10A. Thereby, the port expansion adaptor 102 and mobile PC 100 are attached to the display 12 by means of the holder 202. It should be noted that by upwardly shifting the second holder section 50, and releasing the engagement between the second engaging section 70 and engaging piece 47, the second holder section 50 can be detached from the first holder section 10A.

As described above, in the second embodiment too, the holder 202 which can attach the mobile PC 100 and port expansion adaptor 102 serving as an accessory thereof to the display 12 is provided. The port expansion adaptor 102 can easily be detached from the first holder section 10A and, when the mobile PC 100 is not used, it is possible to electrically connect the port expansion adaptor 102 to some other device and use it.

Furthermore, in the holder 202, the first holder section 10A that stores therein the port expansion adaptor 102 and the second holder section 50 that stores therein the mobile PC 100 are members independent of each other, and it is possible to attach only the first holder section 10A to the display 12. Accordingly, in the first embodiment, when the width of the mobile PC 100 is wider than the size of the VESA standard, it is not possible to pass the screws 15 through the through holes 26 due to the existence of the mobile PC 100. However, according to the second embodiment, even when the width of the mobile PC 100 is wider than the size of the VESA standard, only the first holder section 10A can be attached to the display 12, and hence even in the case of the mobile PC 100 having a greater width, attachment can be carried out. Although in the first embodiment, the mobile PC 100 is fixed to the holder 10 by means of the screws 40, in the second embodiment, the mobile PC 100 is detachably stored in the second holder section 50. Accordingly, it is possible to detach the mobile PC 100 from the holder 202 attached to the display 12, and use the detached mobile PC 100 for some other purpose. Furthermore, when the number of mobile PCs 100 is smaller than the number of displays 12, it is possible to detach the mobile PC 100 together with the second holder section 50 from the first holder section 10A of the holder 202 attached to the display 12, and attach the detached members to a first holder section 10A of a holder 202 attached to another display 12. Thereby, it is possible to cause one mobile PC 100 to be used by a plurality of displays 12.

It should be noted that although the second holder section 50 is engaged with the first holder section 10A in the vertical direction by means of the first engaging section 60 and the second engaging section 70, the manner of engagement associated with the first engaging section 60 and the second engaging section 70 is not limited to this. The second holder section 50 may also be engaged with the first holder section 10A in the horizontal direction.

In the second embodiment, the mobile PC 100 is detachably attached to the second holder section 50, and is not attached to the first holder section 10A by means of the male screws 40 (see FIG. 1) unlike the first embodiment, and hence the mobile PC 100 need not be provided with female screws.

APPLICATION EXAMPLE

Figure 10:
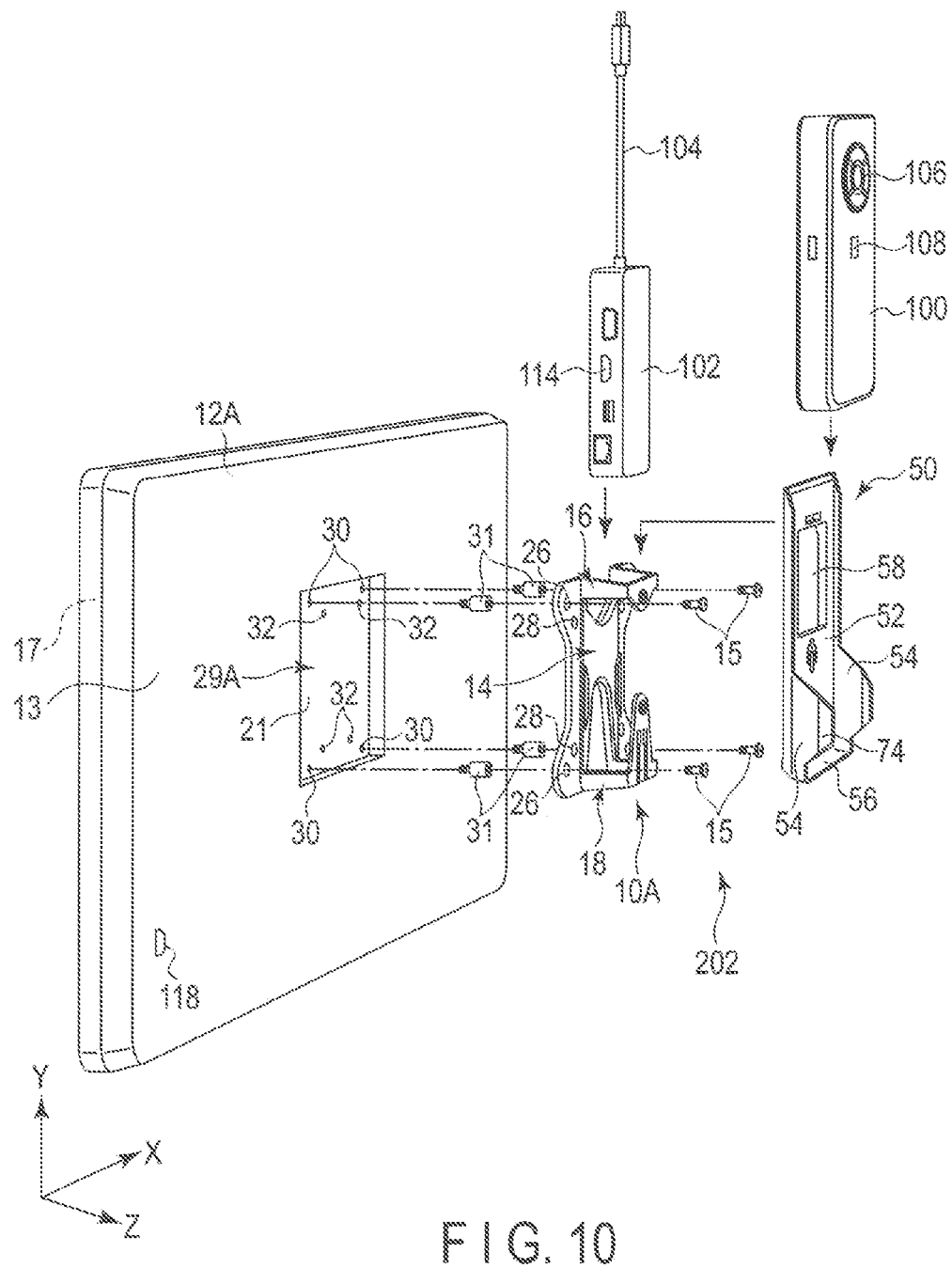
FIG. 10 is an exploded perspective view showing an example of the holder of the second embodiment attached to a display including a recessed-type VESA mount as an example of application.

Although the first and second embodiments have been described by taking the flat-type VESA mount 29 as an example, the types of the VESA mounts 29 include a raised-type in which a mount is formed on a convex portion raised from the backside of the display 12, and recessed-type in which a mount is formed in a concave portion recessed from the backside of the display 12. FIG. 10 shows an example in which the holder 202 of the second embodiment is attached to a display 12A including a recessed-type VESA mount. A concave section 21 is provided in the backside 13 of the display 12A at a center thereof, and a recessed-type VESA mount section 29A is provided on the bottom surface of the concave section 21. When the holder 202 is attached to the VESA mount section 29A, extension screws 31A are used to be connected between the female screw 30 and the male screws 15.

The extension screw 31A has a length equal to the depth of the concave section 21 and, when the extension screw 31A is screwed into the female screw 30 of the VESA mount section 29A, the height of the top face of the extension screw 31A is aligned with the height of the backside 13 of the display 12 other than the concave section 21. By using such extension screws 31A, it is possible to attach the holder 202 of the second embodiment to also the display 12A including the recessed-type VESA mount. It should be noted that the holder is not limited to the holder 202 of the second embodiment, and it is likewise possible to attach the holder 10 of the first embodiment to the display 12A including the recessed-type VESA mount.

The manner of attaching a holder to a display including a raised-type VESA mount is identical to the attaching manner of each of the first and second embodiments described with reference to FIG. 1 to FIG. 9, and hence a detailed description thereof is omitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A holder that attaches a first electronic device and a second electronic device to a display, the holder comprising:
   a first holder section comprising a group of through holes that receives a group of male screws to be screwed into a group of female screws of the display, and storing the first electronic device; and
   a second holder section that attaches to the first holder section and stores the second electronic device wherein the first holder section comprises a first engaging section, the second holder section comprises a second engaging section, and the first engaging section engages with the second engaging section, wherein the first holder section further comprises:
- a base plate comprising the group of through holes;
- an upper holding section, at an upper portion extending from the base plate, that holds the first electronic device; and
- a lower holding section, at a lower portion extending from the base plate, that holds the first electronic device;

the upper holding section comprises:
- a pair of guides extending from the base plate; and
- a coupling member, substantially parallel to the base plate, that couples the pair of guides together, the base plate, the pair of guides, and the coupling member forming an insertion opening, wherein the holder receives the first electronic device through the insertion opening, wherein the holder permits the first electronic device to be removed from the holder through the insertion opening;

the lower holding section comprises:
- a first bottom plate extending from the base plate; and
- a front plate extending from the first bottom plate and substantially parallel to the base plate, and the front plate comprises the first engaging section.

2. The holder of claim 1, wherein the base plate, the pair of guides, the coupling member, the first bottom plate, and the front plate are integrally formed.

3. The holder of claim 1, wherein the second holder section further comprises:
- a holding plate;
- a second pair of guides that holds both side faces of the second electronic device; and
- a second bottom plate that supports a bottom face of the second electronic device; and the holding plate comprises:
- the second engaging section; and
- an engaging piece that engages with the coupling member of the upper holding section.

4. The holder of claim 3, wherein the holding plate, the pair of guides, and the second bottom plate are integrally formed.

5. The holder of claim 1, wherein the group of through holes comprises four through holes formed at four corners of the base plate.

6. The holder of claim 1, wherein the group of female screws are a first group of female screws that conforms to a Video Electronics Standards Association (VESA) standard mount of a first size or a second group of female screws conforming to the VESA standard mount of a second size is formed in the display, and the group of through holes are a first group of through holes that receives corresponding male screws to be screwed into the first group of female screws or a second group of through holes for the second group of female screws is formed in the base plate.

* * * * *